INVENTOR
Jearld L. Hutson

BY Stevens, Davis, Miller & Mosher
ATTORNEYS

INVENTOR
Jearld L. Hutson
BY Stevens, Davis, Miller & Mosher
ATTORNEYS

INVENTOR
Jearld L. Hutson

BY Stevens, Davis, Miller & Mosher
ATTORNEYS

INVENTOR

Jearld L. Hutson

BY

Stevens, Davis, Miller & Mosher

ATTORNEYS

INVENTOR
Jearld L. Hutson
BY
Stevens, Davis, Miller & Mosher
ATTORNEYS

United States Patent Office 3,184,653

Patented May 18, 1965

3,184,653

SWITCHING CIRCUITS

Jearld L. Hutson, Richardson, Tex., assignor to Texas Instruments Incorporated, Dallas, Tex., a corporation of Delaware Filed Oct. 6, 1960, Ser. No. 60,970
22 Claims. (Cl. 317—157.62)

The present invention relates generally to switching circuits, and more particularly, to switching circuits employing a four-layer semiconductor device for rapidly switching currents in inductive load circuits.

It has been recognized for some time that considerably more difficulty is experienced in terminating current flow through a direct current circuit than through an alternating current circuit. Specifically, if during a switching operation in a direct current circuit an arc is struck across the contacts of the switching device, the direct current continues to feed the arc until some external means is employed to extinguish it. In an alternating current circuit, however, the arc is normally extinguished when the voltage goes through zero.

The problem of switching in direct current circuits becomes aggravated when an inductive device is included, for termination of current flow causes the field estabished around the inductor to collapse, thereby increasing the voltage across the open contacts and increasing the probability of arcing. The transient voltage due to the collapse of the field about the inductor rises to whatever value is required to maintain the flow of current in the switching circuit since the rate at which the field in the inductance collapses, and therefore the voltage generated is a function of the switching rate. Thus, if no arcing initially occurs at the instant the contacts are opened, the field about the inductive device collapses almost instantaneously and an extremely high transient voltage is generated which in most instances is sufficient to strike the arc across the opening contacts.

Numerous expedients have been employed to attempt either to prevent the striking of an arc upon opening a D.C. circuit or to minimize the intensity of the arc and render it readily extinguishable. Perhaps the most common type of arrangement for this purpose is the connection of a capacitor across the switching contacts so that the transient current is absorbed in the capacitor and the voltage across the contacts is held to a relatively low value. If the capacitor cannot prevent arcing, it at least reduces the intensity of the arc and therefore reduces the burning of the contacts which otherwise would occur.

In more sophisticated systems, arc draw-out configurations are employed with or without gas generation devices which tend to extinguish the arc. However, in all of these cases, some degree of burning takes place across the contacts and tends to shorten their life. Further, in systems in which the expense incident to the provision of arc drawout and gas blast suppression devices cannot be justified or cannot be physically accommodated, the only practical alternative now being employed is the utilization of the capacitor across the contacts. As indicated above, this solution is not completely satisfactory.

As an example of a circuit in which considerable difficulty is experienced in suppressing and reducing the effects of an arc across switching contacts in a highly inductive circuit, attention is directed to the ignition circuit of the conventional automobile. In such a circuit, breaker points are connected in a series circuit with the primary winding of a spark coil and a condenser is connected across these points in order to suppress the arc generated by the sudden collapse of the field in the spark coil when the breaker contacts are opened. It is well known to anyone who is familiar with the automobile, that the contact points become badly pitted in a relatively short period of time, and further, the capacitor is often in need of replacement due to damage thereto or outright failure thereof.

It has been suggested in the prior art to replace the mechanical switch in series with the primary winding of the spark coil with a transistor and switching the transistor on and off by means of a switch connected in the control electrode circuit, usually the base electrode, of the transistor. The difficulty with such an arrangement is that the ordinary transistor cannot withstand the high voltages generated by collapse of the field in the spark coil upon termination of current in the circuit. Further, the voltage developed across the transistor in such a circuit is sufficiently high to permit some current to flow therethrough, thereby reducing the energy which can be transferred to the secondary circuit.

Because of the importance of a practical and economical circuit whose function is to terminate direct current flow without damaging the components thereof, it is the purpose of the present invention to provide such circuits that overcome the disadvantages of the prior art.

Accordingly, it is an object of the present invention to provide a switching arrangement whereby a high energy voltage pulse is produced in the secondary of a transformer due to a fast transient current pulse in the primary of the transformer.

It is another object of the present invention to provide a switching arrangement whereby the fast transient current pulse in the primary of the transformer results from the dischagre of a capacitor.

It is another object of the present invention in one embodiment to provide a switching circuit employing a semiconductor controlled rectifier as a switching device having the characteristic of a high holding current such that the slope of the load line presented to the controlled rectifier while conducting maintains the conduction current below the holding current value, thereby allowing the controlled rectifier to resume its "off" state when the gate current stops.

It is still another object of the present invention to provide a switching circuit employing a semiconductor controlled rectifier as a switching device that is useful as an automobile ignition system whereby a high energy voltage pulse is induced in the secondary of a transformer at the same repetition rate as the points in the distributor of the automobile are opened and closed.

It is yet another object of the present invention to provide a switching circuit employing a semiconductor controlled rectifier as a switching device having the characteristic of a low holding current such that the slope of the load line presented to the controlled rectifier while conducting, allows the conduction current to exceed the holding current value with means employed to stop conduction of the controlled rectifier at the desired time.

It is still another object of the present invention to provide a switching circuit employing a transistor as a switching device that is useful in an automobile ignition system whereby a high energy voltage pulse is delivered to the secondary of a transformer at the same repetition rate as the points in the distributor of the automobile are opened and closed.

It is another object of the present invention to provide a switching circuit that is useful as an automobile ignition system whereby the points in the distributor of the automobile are never exposed to a voltage exceeding that of the automobile battery.

It is yet another object of the present invention to provide a switching circuit employing at least two capacitors and a semiconductor controlled rectifier as a switching device that has the characteristic of a relatively small holding current whereas the voltage across the capacitors is used in such manner as to aid in returning the controlled rectifier to the non-conduction state at the desired instant after the conduction current of the controlled rectifier has exceeded the holding current value.

It is still another object of the present invention to provide a switching circuit that is useful as an automobile ignition system employing two semiconductor controlled rectifiers, at least one of the controlled rectifiers having the characteristic of a high holding current, whereas the conduction current never exceeds the holding current value, thereby allowing the controlled rectifier having the high holding current value to be returned to its non-conduction state by stopping the gate current.

It is still another object of the present invention to provide a switching circuit that is useful in an automobile ignition system, employing two semiconductor controlled rectifiers acting in cooperation with each other, at least one of the controlled rectifiers having the characteristic of a high holding current, whereby the controlled rectifier of high holding current value is used in conjunction with two capacitors to aid in switching the other controlled rectifier from the conducting to the nonconducting state.

It is still another object of the present invention to provide a switching circuit that is useful in an automobile ignition system employing two semiconductor controlled rectifiers, one of the controlled rectifiers having a relatively small holding current, whereby voltages in excess of the automobile battery supply voltage are generated to aid in returning the low holding current controlled rectifier to its non-conduction state after the desired instant that the conduction current has exceeded the holding current value.

It is still another object of the present invention to provide a switching circuit that is useful in an automobile ignition system employing two semiconductor controlled rectifiers whereby the points in the distributor of the automobile are never exposed to a voltage exceeding that of the automobile battery supply voltage or a current exceeding a few milliamperes.

In addition, it is another object of the present invention to provide a switching circuit that is useful as an automobile ignition system employing at least one semiconductor controlled rectifier whereby a high energy voltage pulse is induced in the secondary of an induction coil due to a magnetic field rapidly collapsing in the primary of the induction coil.

It is still another object of the present invention to provide a switching circuit that is useful as an automobile ignition system employing a transistor acting in cooperation with and aiding in switching a semiconductor controlled rectifier from the conducting to the non-conducting state so as to produce a high energy voltage pulse in the secondary of the automobile induction coil.

It is yet one further object of the invention to facilitate charging of a capacitor to voltages greatly exceeding those of connected power supplies, the charging being advantageously accomplished by transferring inductive energy to the capacitor from an interconnected inductor.

It is still one other object of the invention to improve impulse producing circuits by storing a relatively large quantity of energy in an inductance at one time, transferring the energy to a capacitor at another time, and discharging the capacitor abruptly through a transducer at yet another time.

These and other objects and features of the invention will be apparent from the following detailed description, by way of example, with reference to the drawings in which.

Although specific semiconductor controlled rectifiers, circuits and values of the circuit elements will be designated as preferred embodiments, it will be appreciated that other embodiments may be utilized without departing from the spirit or scope of the invention.

Figure 1:
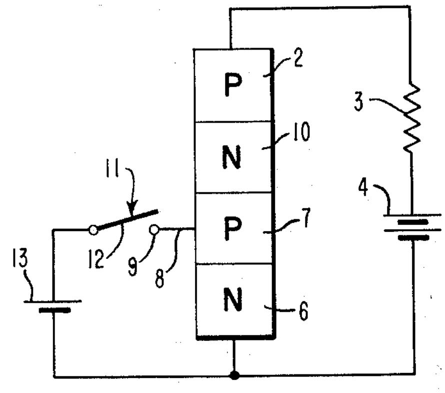
FIGURE 1 is an elementary schematic diagram depicting a controlled rectifier electrically connected in an energization circuit.

Referring specifically to FIGURE 1 of the accompanying drawings there is schematically illustrated a PNPN controlled rectifier, which is utilized in circuits of the present invention, connected in a simple energization circuit. Specifically, the PNPN controlled rectifier has a P region 2, hereinafter referred to as the P-emitter region, connected through a load resistor 3 to the positive terminal of a suitable source of voltage 4. The negative terminal of the source 4 is connected to an N-region 6 of the rectifier hereinafter referred to as the N-emitter region or electrode. A second P region 7, hereinafter referred to as the gate, is connected via a lead 8 to a stationary contact 9 of a switch 11. A movable contact 12 of the switch 11 is connected to the positive terminal of a bias source 13, the negative terminal of which is connected to the N-emitter region 6. The rectifier further comprises an N-region 10 referred to as the N-base region.

Figure 2:
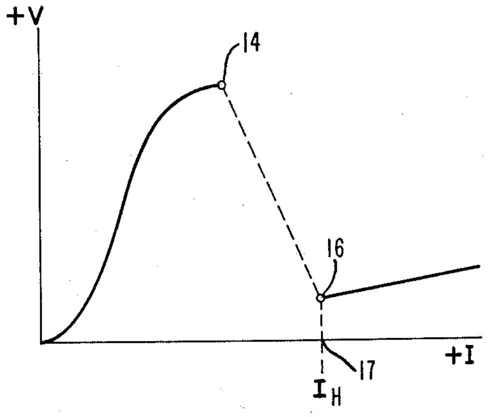
FIGURE 2 is a graph of the general voltage-current characteristics of the controlled rectifier of FIGURE 1.

The general characteristics of the PNPN silicon controlled rectifier approximate, to a certain degree, those of a thyratron, and in order to illustrate the operation of the device, reference is now made to FIGURE 2. FIGURE 2 is a graph of voltage from the P-emitter region 2 to the N-emitter region 6 of the rectifier plotted as a function of the current therethrough. Initially, the curve rises sharply and toward the right so that relatively large increases in voltage are required to produce relatively small changes in current through the device. When the voltage reaches a value characteristic of the particular device and designated by the reference numeral 14, voltage across the device suddenly decreases to a point designated by the reference numeral 16 which in a practical device is about one to two volts. Thereafter, relatively small increases in voltage produce large increases in current through the device.

The numeral 17 in FIGURE 2 designates what is known as the holding current of the device, $I_H$. To turn off the device once the current of the device exceeds the holding current value 17, a voltage of sufficient value and of opposite polarity must be applied from the P-emitter 2 to N-emitter 6 in order to reduce the conduction current below the holding current value. Back-bias voltage can be applied between the gate 7 and N-emitter 6 to aid in reducing the conduction current below the holding current value.

It is a known fact concerning the PNPN semiconductor controlled rectifier that the breakdown voltage is a function of the current across the P-N junction between the N-emitter 6 and the gate region 7. Advantage may be taken of this fact to control the operation or breakdown of the device by establishing a control current across this junction.

Figure 3:
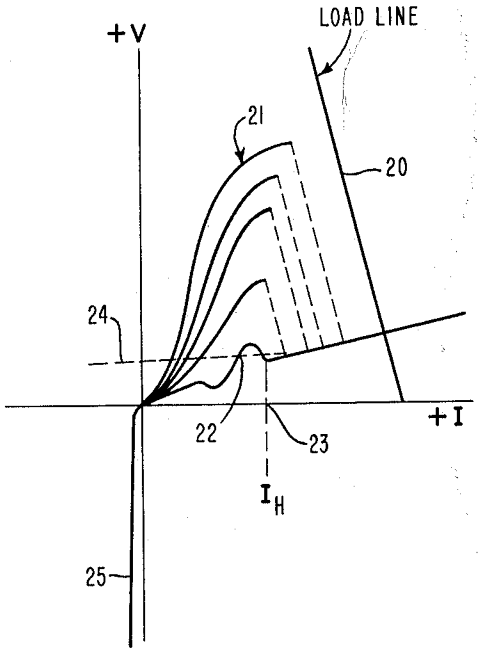
FIGURE 3 is another graph depicting the voltage-current characteristics for several different gate currents for a controlled rectifier of relatively small holding current value with accompanying load line of relatively steep slope.
Figure 4:
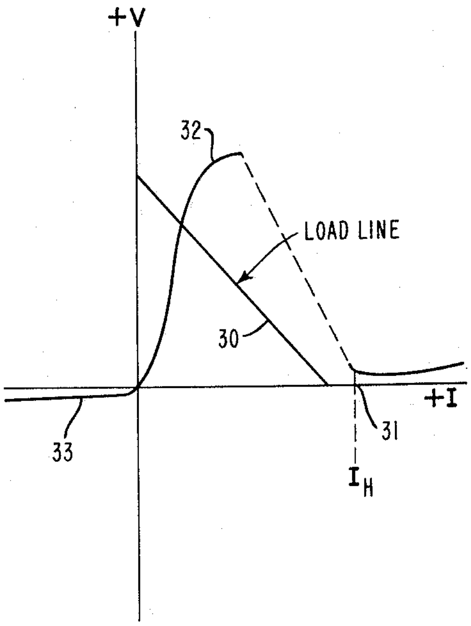
FIGURE 4 is another graph depicting the voltage-current characteristic for a gate current for a controlled rectifier of relatively large holding current value with accompanying load line much less steeply inclined than that of FIGURE 3.

Referring to FIGURES 3 and 4, there are reproduced two sets of voltage-current characteristics for semiconductor controlled rectifiers. FIGURE 3 represents the D.-C. voltage-current characteristics of a controlled rectifier of relatively small holding current 23, say 0.1 to 10 milliamperes, with the corresponding load line 20 of steep slope. In this particular case the numeral 21 represents the voltage-current characteristic for a small current across the junction between the regions 6 and 7 of FIGURE 1, herein referred to as the gate current. The numeral 22 represents a high gate current, with the in-between curves representing intermediate gate currents. FIGURE 3 pertains to the operation of a controlled rectifier that is turned on with a high gate current 22 in conjunction with sufficient P-emitter to N-emitter voltage 24 to cause the current in the device to exceed the holding current 23. The current through and the voltage across the device then follows the load line 20 in FIGURE 3. Simply cutting off the gate current 22 does not return the device to its "off" state but has little effect on its operation. This is seen by the steep slope of the load line 20. To return the device to the "off" state requires, as previously described, a back bias voltage of sufficient value to reduce the conduction current below the value of the holding current. In other words, the device has "fired" like a thyratron, and conduction will continue until it is returned to its "off" state in a manner as described.

The characteristics of a controlled rectifier of relatively large holding current 31, say 30 milliamperes or greater, are reproduced in FIGURE 4. The slope of the accompanying load line 30 is adjusted by the load impedance presented to the device to such a value as not to allow the current of the device to attain the value of the holding current 31. A relatively small gate current 32 allows the device to conduct along the load line 30. The conduction current through the device may be any value and may exceed the holding current for a time. The only requirement for proper operation is that the conduction current through the device be less than the holding current at the time when it is desired to switch the device off. For example, a capacitor may be discharged through the device giving rise to extremely high conduction currents for short times. If the charge of the capacitor is expended before it is desired to turn off the device, i.e., the conduction current through the device is once again below the holding current value, the operation of the device in conjunction with the switch is unimpaired.

To those familiar in the art, it is seen that the operation of a four layer semiconductor controlled rectifier in the conducting condition whereby the conduction current is maintained below the holding current value is similar to the operation of two transistors, a PNP and an NPN, in tandem. In this case the controlled rectifier generates a certain amount of positive feedback, thereby causing the operation of the device to be regenerative to some degree. The regenerative action gives the device the characteristic of a greater current gain than is obtainable with a device having negative or no feedback. With the controlled rectifier's conduction current maintained below the holding current value, it is seen that insufficient positive feedback is generated in order to make the device self-sustaining with regards to its conduction. On the other hand, if enough regenerative action is created by positive feedback, the device will "fire," the conduction current will exceed the holding current value and the conduction of the device will be self-sustained, that is, conduction is maintained with or without gate current.

The controlled rectifier device as represented by the characteristics of FIGURE 4 has shorted reverse characteristics as represented by the numeral 33. In other words, the device conducts in the reverse direction and is almost equivalent to a short circuit as in contrast to the reverse characteristics of the controlled rectifier device represented by the characteristics of FIGURE 3. The numeral 25 of FIGURE 3 denotes the reverse characteristics and indicates that the device will not conduct in the reverse direction. The shorted reverse characteristic 33 of the device as shown in FIGURE 4 is attained during the diffusion process when fabricating the device. The shorted reverse characteristics attained during this diffusion process aid in giving the device the desired high holding current.

Figure 5:
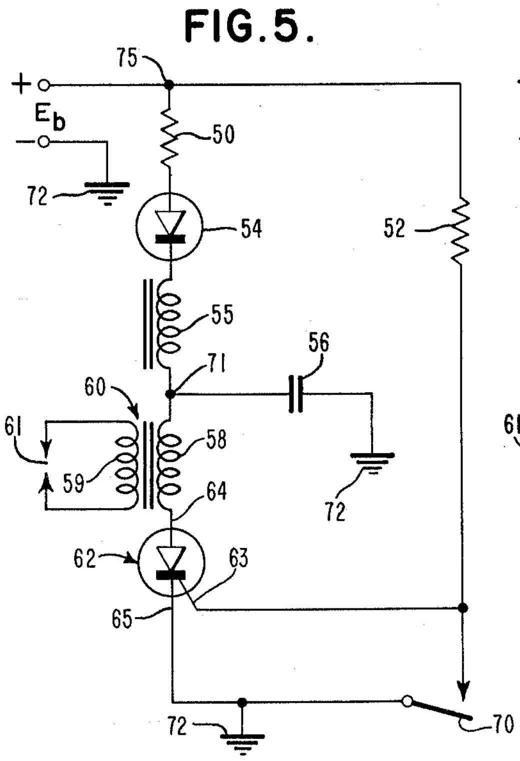
FIGURE 5 is a schematic diagram of one embodiment of the invention employing a controlled rectifier and its related operation as depicted in FIGURE 4.

FIGURE 5 illustrates a circuit that has applicability in an automobile ignition system and employs the controlled rectifier whose characteristics have been previously described in connection with FIGURE 4. The circuit depicted in FIGURE 5 is capable of attaining a very hot spark across the gap 61 of the secondary winding 59 of the transformer 60, and at the same time allowing both very fast and very slow switching rates. The schematic circuit depicted in FIGURE 5 includes: A serial combination of resistor 50 is connected between the positive battery voltage terminal 75 and diode 54, the other end of diode 54 is connected to one end of inductance 55 whose other end is connected to the primary 58 of transformer 60, and the other end of the primary 58 is connected to ground 72 through controlled rectifier 62. The serial combination just described is shunted by resistor 52 which is connected between positive battery voltage terminal 75 and ground 72 through switch 70. Capacitor 56 is connected between the terminal 71 of primary 58 of transformer 60 and ground 72.

To more fully understand the operation of the circuit depicted in FIGURE 5, a description will be given that includes specific values of all components, although other suitable values of these components may be used without departing from the scope of the invention. The following values of the components of the circuit as depicted in FIGURE 5 are known to give optimum results for the use of the circuit as an automobile ignition circuit switching at both fast and slow speeds: $E_b$ is the battery voltage and is equal to 12 volts, resistor 50 has resistance of 3 ohms, resistor 52 has resistance of 100 ohms, diode 54 has the characteristic of low forward resistance and breakdown voltage exceeding 300 volts, inductor 55 has an inductance of about 6 millihenries and a resistance of about 1 ohm, capacitor 56 has a capacitance of 4 microfarads with a corresponding breakdown voltage exceeding 300 volts, controlled rectifier has the characteristic of a holding current in excess of 3 amperes, and switch 70 being the points in the distributor of an automobile ignition system. For optimum performance, transformer 60 will have characteristics specially designed for use in the circuit. Transformer 60 has a primary inductance of approximately 50–100 microhenries and a secondary to primary turns ratio of 200 and an effective capacitance shunting the primary whose value is much less than that of capacitance 56. Assuming that switch 70 is closed when the battery voltage of approximately 12 volts is initially applied to terminal 75, current will flow through resistor 52 to ground 72. Current will not pass through the other series combination of the circuit since the gate 63 of controlled rectifier 62 is at ground potential when switch 70 is closed.

When switch 70 is opened, current flows from terminal 75 through resistor 52 and through gate 63 of controlled rectifier 62 to ground 72. This gate current turns on controlled rectifier 62 and allows a current of approximately 3 amperes to flow from terminal 75 through resistor 50, diode 54, inductance 55, primary 58 of transformer 60 to ground 72 through controlled rectifier 62. The load line of controlled rectifier 62 is such as not to allow the conduction current to exceed the holding current 31 referred to in FIGURE 4. Therefore, controlled rectifier 62 must be fabricated in such a way as to give it a holding current characteristic exceeding 3 amperes. During the time the current is flowing through controlled rectifier 62, energy is stored in inductance 55 in the amount of ½LI². Energy, less in quantity than the amount stored in inductance 55, is also stored in the primary 58 of transformer 60 due to the same current flow of 3 amperes. The circuit remains in this condition until switch 70 is again closed. As switch 70 is closed, gate 63 of controlled rectifier 62 is returned to ground potential. Since the conduction current of controlled rectifier 62 has not exceeded the holding current, the device will return to its "off" state when gate 63 is returned to ground potential. Current no longer flows through controlled rectifier 62, but due to the energy stored in and the effective capacitance shunting the primary 58 of transformer 60 as the current is abruptly stopped, a damped sinusoidal oscillation, commonly known as "ring," is set up in the oscillator composed of primary 58 and the effective shunting capacity thereacross. Since the effective shunting capacitance is slight and the energy stored in primary 58 is relatively small, the resulting "ring" is of very high frequency, thereby allowing the core of transformer 60 to absorb almost entirely all of the energy represented by the "ring." Practically no energy is transferred to the secondary 59 of the transformer 60 due to stopping the 3 ampere current flow in the primary 58, and therefore, preignition or sparking at gap 61 does not occur at this time. Due to the tendency of inductance 55 to maintain the current flow, capacitor 56 will be charged to a voltage greatly exceeding that of the battery potential $E_b$, e.g., to approximately 150 volts. At this time current ceases to flow in inductance 55. Due to the high voltage of capacitor 56 a means is necessary to prevent backward discharging through inductance 55 and resistor 50. (Since controlled rectifier 62 is in its "off" state no current can flow through this portion of the circuit.) Diode 54 prevents reverse current flow, and capacitor 56 retains its charge until controlled rectifier 62 again returns to its "on" state. Controlled rectifier 62 remains in its "off" state until switch 70 again opens. At this time, capacitor 56 discharges rapidly through the primary 58 of transformer 60 to ground through controlled rectifier 62. The discharge results from the placing of capacitor 56 in electrical parallel with the primary 58 through which current can now flow to ground 72. The energy stored in capacitor 56 is much larger than was previously stored in the primary 58 when the 3 ampere current flow was stopped. The shunting capacitance due to capacitor 56 greatly exceeds that of the effective shunting capacitance inherent in transformer 60. Therefore, a damped sinusoidal oscillation of much lower frequency than previously described occurs as a result of the oscillator composed of primary 58, capacitor 56 and the energy stored therein. Because of the low frequency of oscillation, very little energy is lost in the core of transformer 60, and almost entirely all of the energy is transferred to the secondary 59 of transformer 60 as a fast transient high voltage pulse. A spark is generated at gap 61 and can be used as an ignition source.

Since the rate of energy being transferred through the primary 58 of transformer 60 determines the power dissipated across the gap 61, capacitor 56 must be allowed to discharge rapidly through this portion of the circuit. Therefore, the time period of primary 58 and capacitor 56 is adjusted so as to allow this fast discharge. It is well known in the art that the cut-on time of four layer controlled rectifiers is, in general, much more rapid than the cut-off time. Since the cut-on time of controlled rectifier 62 is very rapid, the rate of discharge of capacitor 56 through primary 58 of transformer 60 is not increased thereby. Therefore, by properly adjusting the time period of primary 58 and capacitor 56, very large energy per unit time can be transferred to the secondary 59 of transformer 60 to produce the necessary spark at gap 61.

During the discharge of capacitor 56, the primary 58 of transformer 60 and controlled rectifier 62 will withstand a large current for a very short period of time say, approximately 40 amperes. As soon as capacitor 56 is discharged, normal current will flow, say approximately 3 amperes, through inductance 55 and transformer primary 58. Again, energy is stored in inductance 55, and the cycle starts over. By operating the switch 70 in the desired sequence, the spark in gap 61 may be obtained at desired intervals.

Figure 6:
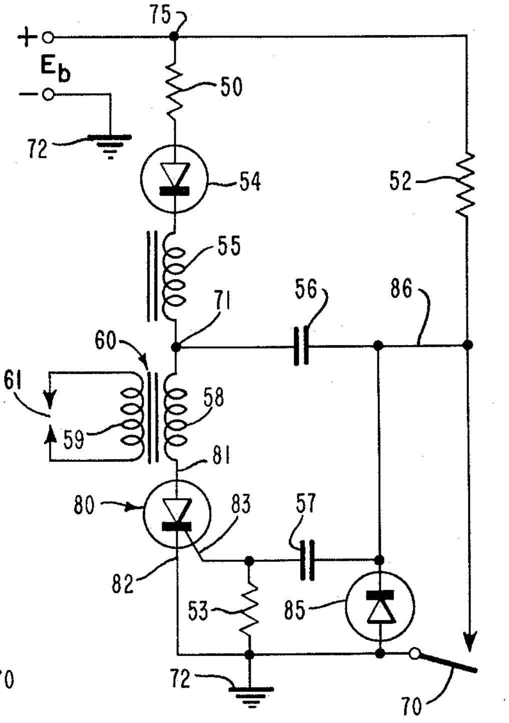
FIGURE 6 is a schematic diagram of another embodiment employing a controlled rectifier and its related operation as depicted in FIGURE 3.

FIGURE 6 depicts a circuit that is very similar to that of FIGURE 5 with the exception that controlled rectifier 80 is characterized by a much smaller holding current value than that of controlled rectifier 62 previously described. The holding current value of controlled rectifier 80 is only a few milliamperes and when the controlled rectifier is cut on, the conduction current from P-emitter to N-emitter exceeds that of the holding current value. Therefore, the operation of controlled rectifier 80 in this circuit is not similar to that as described in FIGURE 3, and simply returning the gate 83 to ground potential does not return the device to its "off" condition. Other techniques must therefore be used to make the circuit operate successfully when using a controlled rectifier of such small holding current. FIGURE 6 is an example of such a circuit that will work successfully. However, it employs an additional capacitor and diode.

Capacitor 56 is connected between primary 58 of transformer 60 and switch 70 to serve the dual purpose of aiding in turning off controlled rectifier 80 and also supplying the current pulse that produces the spark at gap 61. The additional capacitor 57 is connected between gate 83 of controlled rectifier 80 and switch 70 to serve the purpose of aiding in cutting off controlled rectifier 80. The other addition, diode 85, bypasses switch 70 in order to provide a current path for discharge of capacitor 56.

Assuming that switch 70 is initially closed when the battery voltage $E_b$ is applied to terminal 75, current will flow through resistor 52 to ground. Controlled rectifier 80 will not conduct as yet since no gate current has been provided to turn it on. When switch 70 is opened, current flows through the serial combination of resistor 52, capacitor 57 and resistor 53 to ground 72, thereby raising the voltage at gate 83 and cutting on controlled rectifier 80. Current then flows from terminal 75 through resistor 50, diode 54, inductance 55, and primary 58 of transformer 60 to ground 72 through controlled rectifier 80. The voltage at terminal 71 between inductance 55 and primary 58 of transformer 60 drops rapidly to approximately one or two volts above ground potential due to the conduction of controlled rectifier 80. Once the voltage at terminal 71 is dropped to a low value, current flows from terminal 75 through resistor 52 and capacitor 56, thereby charging said capacitor to a value of approximately $E_b$ minus the one or two volts drop across controlled rectifier 80. During this time, capacitor 57 is charged to its full value, and current no longer flows through the gate 83 of controlled rectifier 80. Although gate 83 of controlled rectifier 80 is now returned to ground potential, the device continues to conduct since it has exceeded its holding current value. Also, during the conduction time of controlled rectifier 80, energy is being stored in inductance 55 in the amount of ½LI². The circuit now remains in this state until switch 70 is again closed. When switch 70 is closed the voltage at terminal 71 and the voltage at gate 83 of controlled rectifier 80 drop to about eleven volts below ground potential due to the charge on capacitors 56 and 57, respectively. The negative voltages applied across both P-emitter 81/N-emitter 82 and gate 83/N-emitter 82 reduce the conduction current below the holding current value, thereby causing the device to return to its off state. Transformer 60 with its related primary and effective capacitance features are essentially the same as those described in conjunction with FIGURE 5 and no preignition occurs at this time.

As previously described in conjunction with FIGURE 5, inductance 55 tends to sustain the current flow in the circuit. Since controlled rectifier 80 is now cut off and current cannot flow in this path, inductance 55 charges capacitor 56 to a large value to approximately 150–200 volts. Diode 54 again serves the purpose to prevent this charge from leaking off. As switch 70 is again opened, charging current for capacitor 57 flows to gate 83 and thence, to ground, thereby causing the controlled rectifier 80 to return to its "on" state. A high current discharge through primary 58 of transformer 60 in the amount of approximately 40 amperes is produced due to the high voltage charge on capacitor 56. Diode 85 provides the path for which this discharge can take place since switch 70 is now open. Once the discharge of capacitor 56 through the primary 58 of transformer 60 is completed, the cycle starts over.

It is seen that the circuit as depicted in FIGURE 6 produces the same results as that of FIGURE 5 while at the same time utilizing a controlled rectifier device that has a much smaller holding current value.

Figure 7:
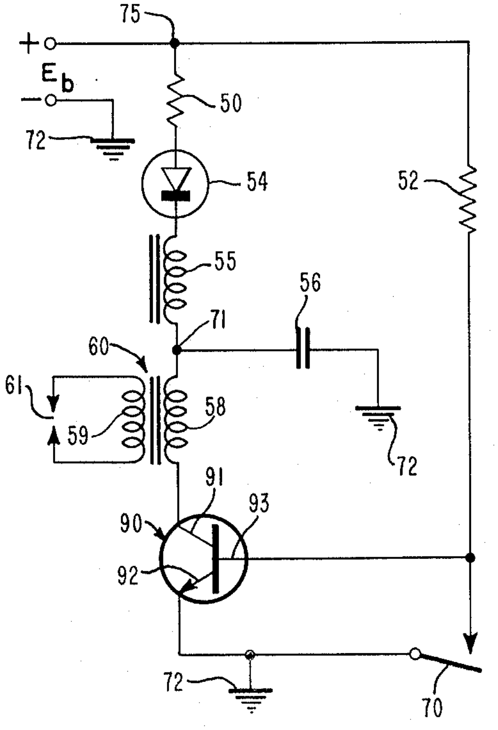
FIGURE 7 is a schematic diagram of yet another embodiment employing a transistor.

Illustrated in FIGURE 7 is a circuit very similar to that of FIGURE 5 with the exception that controlled rectifier 62 is replaced by a transistor 90 of special characteristics. Transistor 90 must have the characteristics of withstanding a current flow of approximately 3 amperes from collector to emitter. In addition, it must be able to withstand the current surge of approximately 40 amperes as capacitor 56 discharges through primary 58 of transformer 60 to produce the spark at gap 61. By replacing controlled rectifier 62 with transistor 90, the concern with holding current is eliminated, for transistor 90 may be cut off rapidly by simply returning the base 93 to ground potential. The simple operation of opening and closing switch 70 cuts the transistor 90 on and off, respectively.

The operations of the circuits as illustrated in FIGURES 5 and 7 are identical with the exception that a transistor in the latter circuit replaces the controlled rectifier device in the former circuit. Those familiar in the art will realize that a controlled rectifier device will much more readily sustain the high current pulses necessary for the operation of this circuit. Therefore, the circuit as illustrated in FIGURE 5 is more desirable from this standpoint than that illustrated in FIGURE 7. It should be noted, however, that in both circuits successful operation can be effected by simply opening and closing a switch 70. FIGURE 6 represents a circuit in which the featured type of operation is possible due to the characteristics of the controlled rectifier device employed. However, as previously explained, successful operation is effected by the action of capacitors 56 and 57 which aid in cutting off the controlled rectifier device when necessary. In addition, it should be pointed out with regard to FIGURE 6 that the switch 70, or what will normally be the points in an automobile ignition system, carries a high current during one portion of the cycle as the stored energy in inductance 55 charges capacitor 56 to the high voltage necessary to produce the high current pulse. Switch 70 is closed at this time and must carry approximately 3 amperes of current. However, no burning or pitting of the switch or points is encountered due to this high current flow since the switch remains closed during this interval. The ordinary automobile points or switch are sufficiently large in cross-sectional area to withstand a 3 ampere current flow without great damage to the critical parts. This is in contrast to the old automobile ignition circuit in which high voltage is generated across the points or switch when they are opened. Such high voltage increases tend to produce a spark across the points thereby pitting them and burning them.

Figures 8, 9, 10:
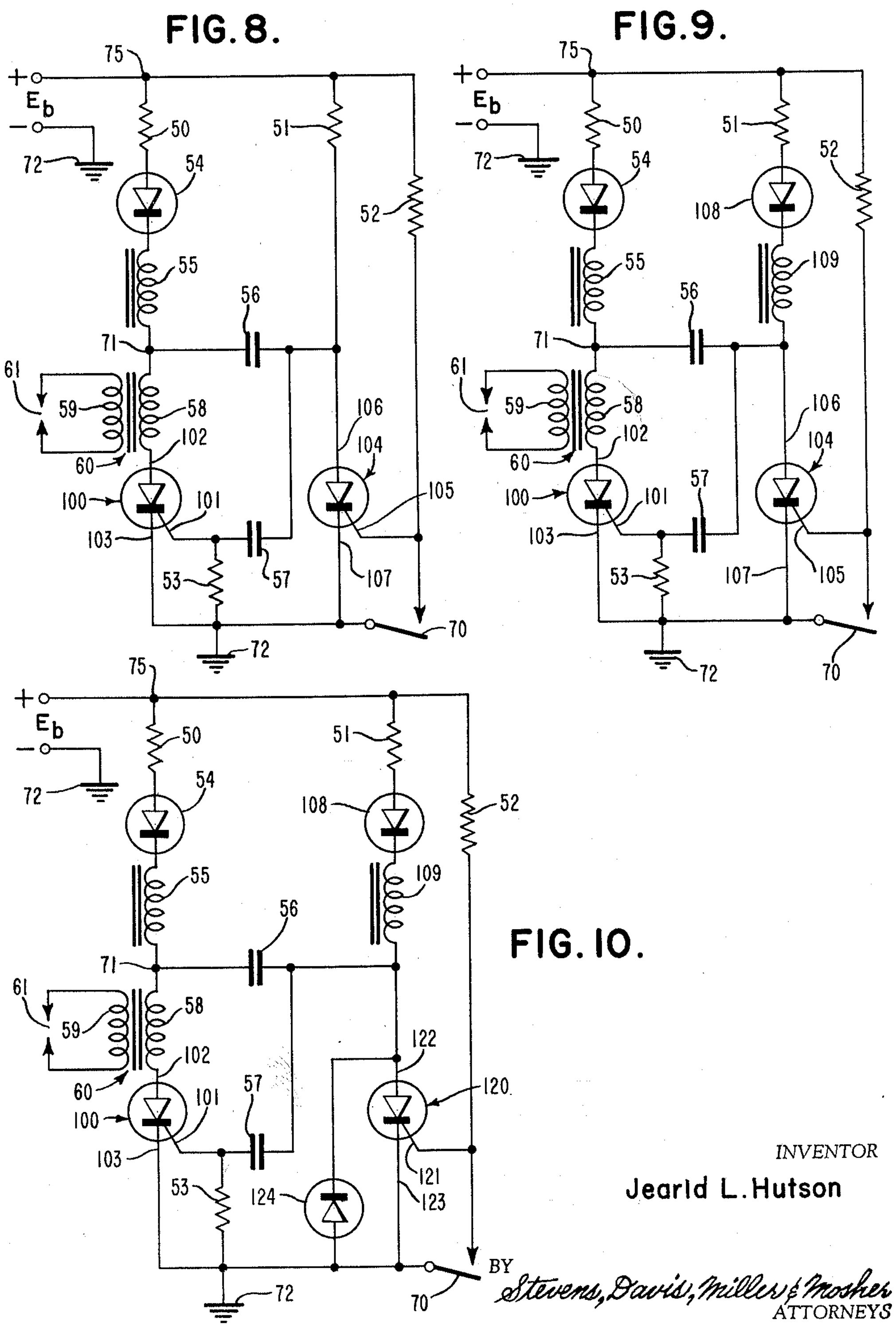
FIGURE 8 is a schematic diagram of still another embodiment employing the cooperative action between two controlled rectifiers of different characteristics as depicted in FIGURES 3 and 4, respectively.
FIGURES 9, 10, 11 and 12 are schematic diagrams of still other embodiments employing cooperative action between two controlled rectifiers.

For successful operation of the circuit as illustrated in FIGURE 5, the controlled rectifier must have characteristics such that it will stand a normal P-emitter to N-emitter current flow of approximately 3 amperes and have a high holding current, that is, in excess of three amperes. There are many controlled rectifier devices that are produced that do not possess both of these desirable features. In many instances a controlled rectifier device can be fabricated in such a way as to give it a characteristic of a high holding current but cannot withstand the high P-emitter to N-emitter current flow. In other cases where a controlled rectifier device is fabricated such that the device will withstand a high P-emitter to N-emitter current flow, the holding current is usually of a low value. When such is the case, two controlled rectifiers of different characteristics are utilized as illustrated in FIGURE 8 to perform the desired function as an automobile ignition system. In FIGURE 8, the points or switch 70 are operatively isolated from all possible high energy parts of the circuit, as distinguished from the circuits of FIGURE 6. Referring to FIGURE 8, the switch 70 never carries a current greater than a few milliamperes. Controlled rectifier 100 has a characteristic of sustaining a high current flow from P-emitter to N-emitter but has the disadvantage of a low holding current. Controlled rectifier 104 does not have to withstand such high current flow but does have a high holding current. Controlled rectifiers 100 and 104, respectively, act in cooperation with each other such that the desired switching from one to the other may be effected.

The schematic circuit in FIGURE 8 includes: Two controlled rectifiers 100 and 104 acting in cooperation with each other, controlled rectifier 104 performing the function of cooperating with switch 70 to switch the controlled rectifier 100 to the "on" state or the "off" state, whichever the case may be; the P-emitter 106 of the controlled rectifier 104 being connected to the positive battery terminal 75 through the series resistance 51, and N-emitter 107 of the controlled rectifier 104 being connected directly to ground 72. Resistor 52 is connected from the positive battery terminal 75 to gate 105 of the controlled rectifier 104 in partial shunt of the serial combination of resistor 51 and controlled rectifier 104, and the gate 105 is also electrically connected to the switch 70, the other side of switch 70 being connected directly to ground 72. One end of resistor 50 is connected to the positive battery terminal 75, the other end of resistor 50 is connected to the anode of diode 54; the cathode of diode 54 is connected to one end of the inductance 55, the other end of the inductance 55 being connected to one end of the primary 58 of transformer 60; the other end of the primary 58 is connected to the P-emitter 102 of controlled rectifier 100, and the N-emitter 103 is connected directly to ground 72. Capacitor 56 interconnects the P-emitter 106 of controlled rectifier 104 with the junction between inductance 55 and primary 58 of transformer 60; and capacitor 57 interconnects the P-emitter 106 with gate 101 of controlled rectifier 100, the gate 101 being connected to ground 72 by resistor 53.

To more fully clarify the operation of the circuit referred to in FIGURE 8, assume that both controlled rectifiers 100 and 104 are initially in their "off" state and that switch 70 is closed. If a D.C. voltage $E_b$ is applied at terminal 75, current will flow from terminal 75 through resistor 52 to ground 72, thereby preventing controlled rectifier 104 from conducting by putting the gate 105 at ground potential 72. Current also flows through the series path of resistor 51, capacitor 57 and resistor 53 to ground 72. During the time that capacitor 57 is charging, some current flows through gate 101 of controlled rectifier 100 to ground 72, thereby causing controlled rectifier 100 to conduct. Reference to FIGURE 3 shows that controlled rectifier 100 is "cut on" by a relatively small gate current, say 10 milliamperes, and the conduction of current from the P-emitter 102 to N-emitter 103 exceeds that of the holding current, where the holding current is less than, say 20 milliamperes. The voltage of the P-emitter 102 drops from the original $E_b$ value to approximately one volt above ground potential due to conduction of controlled rectifier 100, thereby allowing capacitor 56 to charge through resistor 51. At the same time, current flows through the series combination of resistor 50, diode 54 and inductance 55, thereby storing energy in inductance 55. Also during this time, capacitor 57 is charged up, and no more current flows through resistor 53. This returns gate 101 to ground potential but does not stop the controlled rectifier 100 from conducting due to the characteristics as explained in connection with FIGURE 3.

After capacitor 56 is charged, the circuit remains in a steady-state condition until switch 70 is opened. The capacitors 56 and 57 are charged to a voltage of approximately $E_b$. When switch 70 is opened, current flows through gate 105 of controlled rectifier 104 and causes current to flow from P-emitter 106 to N-emitter 107 but not in excess of the holding current. The gate current required to turn on this device is approximately 10 milliamperes. The characteristics of this device are as described in FIGURE 4 and this operation should be distinguished from that of controlled rectifier 100.

As controlled rectifier 104 conducts, the voltage of the P-emitter 106 drops from approximately $E_b$ to about one volt or less above ground potential. The voltages at connection 71 and gate 101 drop to approximately a value of $E_b$ below ground potential due to the voltages on capacitors 56 and 57, thereby back-biasing both the P-emitter/N-emitter and gate/N-emitter of controlled rectifier 100, cutting it off. As previously indicated, no spark or large energy release at gap 61 of transformer 60 occurs at this time due to the relative values of the circuit components.

Inductance 55 tends to sustain the current flow even though controlled rectifier 100 acts as an open circuit. Therefore, inductance 55 forces current from terminal 75 through capacitor 56 and controlled rectifier 104 to ground 72. The large amount of energy stored in inductance 55 will be transferred to capacitor 56 as a large voltage, say 150–200 volts. Diode 54 prevents the energy represented by this voltage from draining off until the proper current path is provided.

As switch 70 is again closed, thereby grounding gate 105 of controlled rectifier 104 and consequently returning it to its "off" state, current flows through resistor 51, charging up capacitor 57 through resistor 53 and placing a potential on gate 101 of controlled rectifier 100. This action again turns on controlled rectifier 100, thereby returning it to its "on" state. At the instant controlled rectifier 100 turns on, the large voltage stored in capacitor 56 discharges through the primary 58 of transformer 60 as a high current transient pulse. The conduction path for this current pulse is through primary 58, controlled rectifier 100 to ground, and back through controlled rectifier 104 in the reverse direction. As stated previously, the shorted reverse characteristics of controlled rectifier 104 act as a short circuit thereby allowing current to flow through it in the reverse direction. As the high energy current pulse passes through primary 58 of transformer 60, a high energy voltage pulse is transferred to the secondary 59, thereby causing a spark to be generated across gap 61.

As previously mentioned, the cut-on time of controlled rectifier 100 is much more rapid than the cut-off time. In order to exploit this relationship advantageously, the circuits are arranged so that the high energy current pulse creating the spark across gap 61 passes through primary 58 of transformer 60 during the cut-on time of controlled rectifier 100. Because of the extremely fast cut-on time of controlled rectifier 100, this allows the high energy current pulse to have an extremely fast transient time. This, of course, means that the current pulse delivers a large amount of power to the secondary of transformer 60 since the power is directly proportional to the rate of change of energy with respect to time.

Again, capacitors 56 and 57 charge to approximately $E_b$ as before and the cycle starts over. It is a distinct feature of this circuit that because of the well adjusted load line characteristics of both controlled rectifiers 100 and 104 and the transfer of the energy to the primary of transformer 60 during the cut-on time of controlled rectifier 100, high repetition rates can be attained and at the same time ample energy can be transferred to the gap 61 of transformer 60. The importance of the action of capacitors 56 and 57 in back-biasing controlled rectifier 100 to aid in cutting it off, and the transferring of the high energy current pulse by capacitor 56 through the primary 58 of transformer 60 should be noted.

In certain instances it would be desirable to have more voltage across capacitors 56 and 57 than represented by $E_b$ during the time that these capacitors are back-biasing controlled rectifier 100. FIGURE 9 represents an arrangement which accomplishes this. It depicts a circuit very similar to that of FIGURE 8 except for a series combination of diode 108 and inductance 109 which have been added between resistor 51 and P-emitter 106 of controlled rectifier 104.

The operation of the circuit in FIGURE 9 is the same as that of FIGURE 8 with the exception that the serial combination of diode 108 and inductance 109 increase the voltage on capacitors 56 and 57 during their initial charging time. Assume that the circuit is switching from the operation of one controlled rectifier to the other due to the opening and closing of switch 70. If switch 70 is closed, controlled rectifier 104 will be off, controlled rectifier 100 will be conducting, and capacitors 56 and 57 will be charged to a voltage of approximately $E_b$. If switch 70 is opened, controlled rectifier 104 will conduct due to gate current from gate 105 to ground 72. A larger current then flows through the serial combination of resistor 51, diode 108 and inductance 109 due to the conduction of controlled rectifier 104, thereby storing energy in inductance 109. None of this current flows through capacitors 56 and 57 due to the voltage across them in the amount of $E_b$. Because of the conduction of controlled rectifier 104, controlled rectifier 100 is backbiased by capacitors 56 and 57 as before. Inductance 55 charges capacitor 56 to a large voltage as before. The voltage across capacitor 56 remains there until switch 70 is closed, and then discharges through the primary 58 of transformer 60, producing the spark at gap 61. During the operation of closing switch 70, thereby cutting off controlled rectifier 104, inductance 109 tends to sustain the current flow. Due to this stored energy and the battery voltage of $E_b$ capacitors 56 and 57 are charged to a voltage of approximately $2E_b$ or greater. These greater voltages allow capacitors 56 and 57 to more forcefully backbias controlled rectifier 100 at the appropriate time. Since capacitors 56 and 57 are charged to a voltage greater than $E_b$, the excess charge would leak-off were it not for the presence of diode 108.

It is possible to operate circuits similar to those of FIGURES 5 and 6 without the special shorted reverse current characteristic described for controlled rectifier 104. For instance, FIGURE 10 depicts a switching circuit with controlled rectifier 120 having reverse current characteristics essentially the same as those of controlled rectifier 100 as described in conjunction with FIGURE 3. However, the forward current characteristics of controlled rectifier 120 are essentially the same as those of controlled rectifier 104 shown in FIGURES 8 and 9 and described in FIGURE 4. In such case, controlled rectifier 120 is bypassed by the diode 124 such that current will flow in the reverse direction as capacitor 56 discharges through transformer 60 to create the spark at gap 61. Diode 124 only conducts in one direction and does not affect the operation of the circuit in any other manner.

Figure 11:
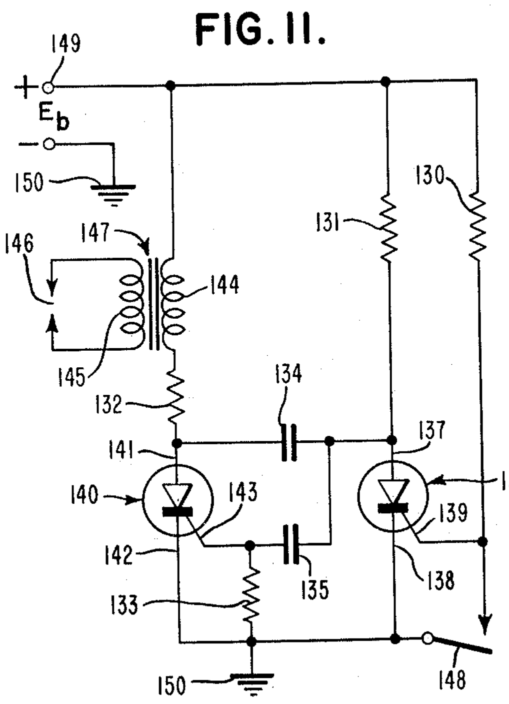

Referring again to the characteristic curves of the two controlled rectifiers as depicted in FIGURES 3 and 4, the co-operative action between two such controlled rectifiers can be used in other unique switching circuits as is illustrated in FIGURES 11 to 14 inclusive. More specifically, FIGURE 11 is a schematic of a switching circuit using the principle of the induction coil to create a spark across a gap. As illustrated in FIGURE 11, controlled rectifier 136 and switch 148 act in cooperation to aid in cutting-off and cutting-on controlled rectifier 140. The circuit of FIGURE 11 includes: a serial combinaion of resistor 131 connected from the positive D.C. potential 149 to P-emitter 137 of controlled rectifier 136, the N-emitter 138 being connected to ground potential 150; the serial combination of resistor 131 and controlled rectifier 136 being shunted by resistor 130 from positive potential 149 through switch 148 to ground 150; gate 139 of controlled rectifier 136 being connected at times to ground 150 by switch 148. A serial combination is provided by connecting the primary 144 of induction coil 147 to positive potential 149, the other end of primary 144 connected to resistor 132, the other end of resistor 132 connected to P-emitter 141 of controlled rectifier 140, and N-emitter 142 connected to ground potential 150. Capacitor 134 interconnects P-emitter 137 of controlled rectifier 136 with P-emitter 141 of controlled rectifier 140, capacitor 135 connects P-emitter 137 of controlled rectifier 136 to gate 143 of controlled rectifier 140, and the gate 143 is connected to ground 150 by resistor 133.

In considering the operation of the circuit of FIGURE 11, it will be helpful to assume that controlled rectifiers 136 and 140 are initially in the "off" state and that switch 148 is closed. As the D.C. positive potential is applied at terminal 149, current flows both through resistor 130 to ground potential 150 and through the serial combination of resistor 131, capacitor 135 and resistor 133 to ground 150. A positive bias is created across the gate 143/N-emitter 142 of controlled rectifier 140 due to current through resistor 133. The characteristics of controlled rectifier 140 are as described in conjunction with FIGURE 3, and therefore said controlled rectifier fires to the "on" state due to the current from gate 143 to N-emitter 142. Shortly after controlled rectifier 140 switches to the "on" state, capacitor 135 becomes charged, and current no longer flows through resistor 133, thereby returning gate 143 to ground potential but not effecting the conduction of controlled rectifier 140. When controlled rectifier 140 begins conduction, P-emitter 141 drops from $E_b$ to approximately one volt above ground, causing capacitor 134 to charge due to the current flowing therethrough. A steady current also now flows through the serial combination of primary 144 of induction coil 147, resistor 132 and controlled rectifier 140, thereby storing energy in the primary 144 of induction coil 147. Again, steady state operation is maintained until switch 148 is opened.

Upon opening of switch 148, current flows through the serial combination of resistor 130, gate 139 and N-emitter 138 to ground 150. Capacitors 134 and 135 backbias controlled rectifier 140 as previously described in conjunction with FIGURE 8, thereby aiding in cutting it off. This action discharges capacitors 134 and 135. The energy stored in the primary 144 of induction coil 147 tends to sustain the current flow due to the collapsing field therein.

As a result, a large voltage is induced in the secondary of induction coil 147, creating a spark at gap 146. Due to the collapsing field in primary 144 and the values of inductance and capacitance employed, oscillations are produced momentarily in the circuit comprising the primary 144 of induction coil 147, resistor 132 and capacitor 134. These oscillations are very short in duration and die out before the next cycle begins. Once the spark has been created at gap 146, the circuit remains in the steady-state condition until switch 148 is again closed. When switch 148 closes, controlled rectifier 136 cuts off, capacitors 134 and 135 charge and the cycle starts over.

Figure 12:
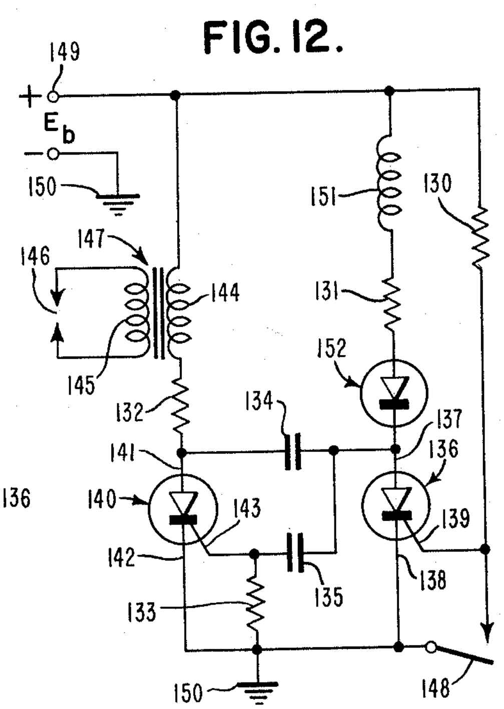

Reference to capacitors 134 and 135 as shown in the circuit of FIGURE 11 will show that these capacitors can never be charged to a value greater than $E_b$ during their charging cycle. The purpose of these capacitors is to aid in cutting off controlled rectifier 140 by back-biasing the various regions thereof and draining out the excess current carriers. In many instances, it would be desirable to back-bias controlled rectifier 140 with a greater voltage than is represented by the battery voltage $E_b$. To effect this end, FIGURE 12 represents a schematic of a circuit whose operation is identical with that of FIGURE 11 with the exception that an inductance 151 and diode 152 have been added to the load circuit of controlled rectifier 136. During the time that controlled rectifier 136 is conducting, energy is being stored in inductance 151. As switch 148 closes, thereby cutting off controlled rectifier 136, inductance 151 tends to sustain the current flow. In doing so, capacitors 134 and 135 are charged to a greater voltage than is represented by the battery potential $E_b$. Diode 152 prevents this excess voltage from leaking off in the reverse direction. When switch 148 is again opened, much greater voltage is available on capacitors 134 and 135 to cut on controlled rectifier 140. This means that the circuit represented in FIGURE 12 would operate more efficiently in a conventional 12 volt car system than the circuits of FIGURE 11.

It is a feature of the operation of the circuit as depicted in FIGURE 12 that effective action is employed in turning off controlled rectifier 140 from a state of high current conduction. It is realized by those familiar with the art that the process of cutting off a controlled rectifier is very difficult when the conduction current of the rectifier has greatly exceeded the holding current value. This is essentially the case with the operation of the circuit of FIGURE 12 whereby the typical value of the holding current of controlled rectifier 140 is a few milliamperes and the conduction current is well in excess of one ampere. Thus, the importance of the actions of capacitors 134 and 135 is realized. That is, capacitors 134 and 135, during the back-bias operation, instantaneously drive large currents through controlled rectifier 140 in the opposite direction of the conduction current, thereby reducing the conduction current below the holding current value and cutting it off.

FIGURE 13 depicts a circuit again similar to that of FIGURE 11 where transistor 209 replaces controlled rectifier 136. Transistor 209 need only be able to withstand the current flow through resistor 201 and the discharge current of capacitor 207.

Figure 13:
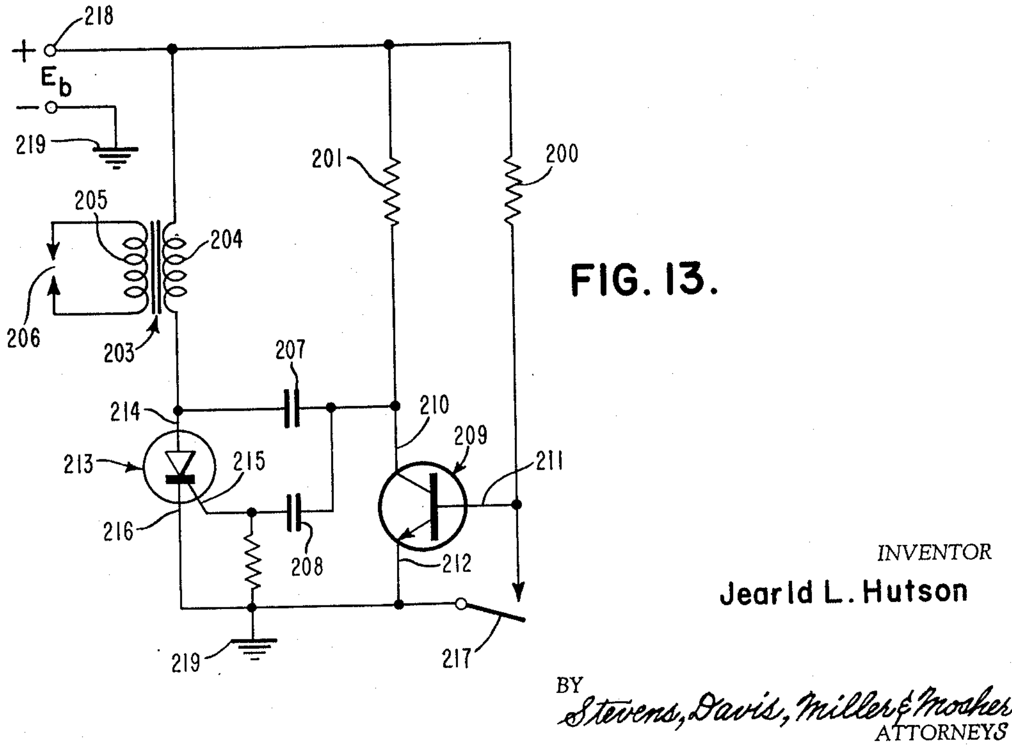
FIGURE 13 is a schematic diagram of an embodiment in which a transistor is cooperatively associated with a controlled rectifier.
Figure 14:
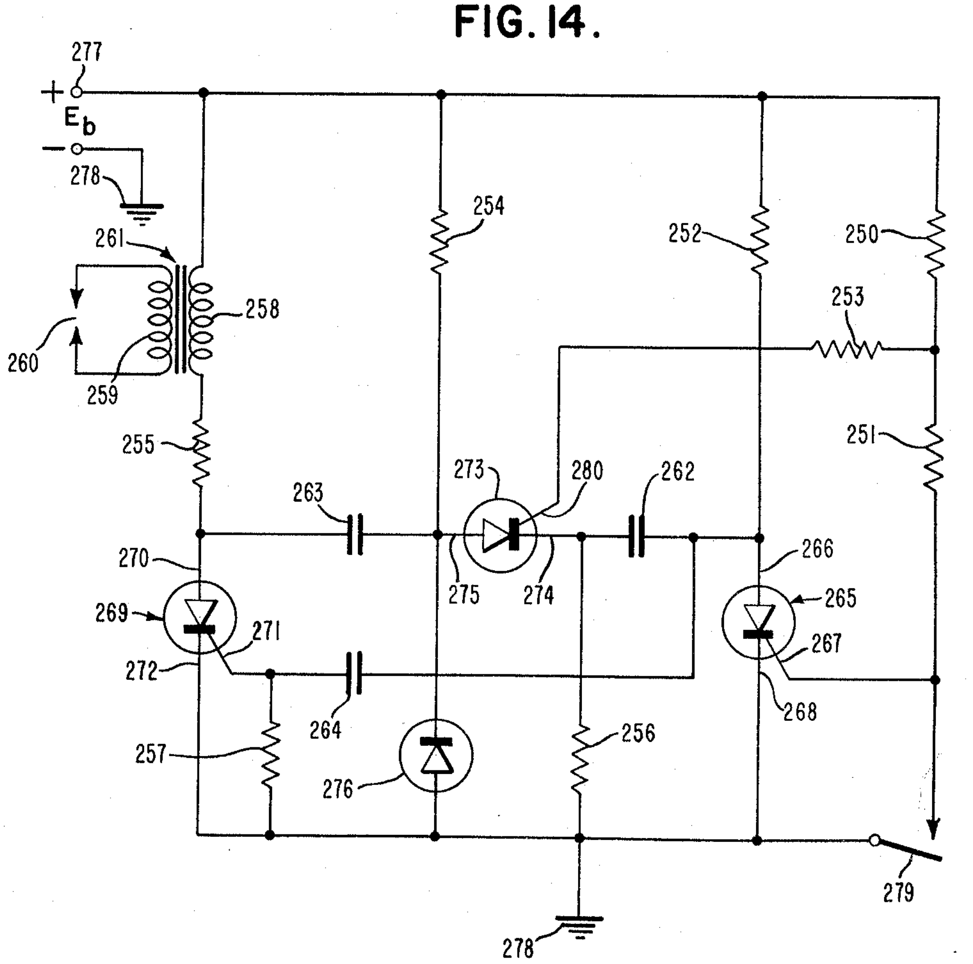
FIGURE 14 is a schematic diagram of an embodiment in which three controlled rectifiers are advantageously exploited.

In many instances the conventional automobile coil has a comparatively high primary inductance and a comparatively low secondary to primary turns ratio. Although the circuits as depicted in FIGURES 11 through 13 inclusive will function with the ordinary automobile ignition coil, these circuits will operate more efficiently and give a hotter spark at gap 146 if the ordinary coil is replaced by one whose primary inductance is of smaller value and whose turns ratio is greater. If the ordinary automobile ignition coil is not replaced, FIGURE 14 represents a circuit whose additional components and their related actions give the desired high energy spark at gap 260. The ordinary automobile coil with its comparatively high primary inductance makes the action of circuits 11 through 13 less attractive in that the time period of primary winding 144 and capacitor 134 is longer than desirable. This means that the voltage pulse created in the secondary of inductance coil 147 is not as large as it could be if the oscillation of primary 144 and capacitor 134 lasted for a shorter period of time. Since the value of capacitor 134 as shown in FIGURES 11 and 12 cannot be greatly reduced and yet perform its desired function, another alternative must be employed. By employing more voltage in cutting off controlled rectifier 140, controlled rectifier 140 may be made to cut off faster thereby making the field in inductance coil 147 collapse faster, producing a higher voltage in the secondary 145. FIGURE 14 depicts a circuit whose additional components and their related action give such a desired result.

The circuit of FIGURE 14 contains, in addition to the components of FIGURE 11, four resistors, one capacitor, one diode and one controlled rectifier. A serial combination of capacitor 262 and controlled rectifier 273 is connected between the P-emitter 266 of controlled rectifier 265 and capacitor 263 as shown in FIGURE 14. Diode 276 is connected with polarity as shown between the P-emitter 275 of controlled rectifier 273 and ground 278. An additional resistor 256 is connected between the N-emitter 274 of controlled rectifier 273 and ground 278. The original resistor 130 as shown in FIGURE 11 is now replaced by resistors 250 and 251 as shown in FIGURE 14, and an additional resistor 253 is connected between the junction of resistors 250 and 251 and gate 280 of controlled rectifier 273. The performance of the circuit as shown in FIGURE 14 is very similar to that of FIGURE 11.

Assuming that switch 279 is closed when the battery potential is initially applied to terminal 277, and assuming that battery voltage is 12 volts, current will flow through resistors 250 and 251 to ground. Since switch 279 is closed, the gate 267 of controlled rectifier 265 is grounded; thereby maintaining the device in a non-conductive condition. Since switch 279 is closed this also prevents current from flowing through resistor 253 through gate 280 of controlled rectifier 273. Again, this prevents controlled rectifier 273 from conducting. During the time the switch 279 is closed, another current path is provided from terminal 277 through resistor 252, capacitor 262, and resistor 256 to ground 278. As this current flows, capacitor 262 charges to approximately the battery potential. Current also flows from terminal 277 through resistor 252, capacitor 264, and resistor 257 to ground 278. Some current flows through the gate 271 of controlled rectifier 269 to ground, thereby cutting on this device. As controlled rectifier 269 cuts on, another current path is provided from terminal 277 through resistor 254, capacitor 263, and controlled rectifier 269 to ground 278. After steady-state is reached, all three capacitors 262, 263, and 264, are charged to approximately battery potential. The circuit remains in this state until switch 279 is opened. As switch 279 is opened, current flows from terminal 277 through resistor 250, resistor 251, and gate 267 of controlled rectifier 265 to ground 278, thereby cutting on this device. The voltage at terminal 266 is lowered to approximately one volt above ground potential. At the same time, enough current flows through gate 280 of controlled rectifier 273 to cut this device on.

Once controlled rectifier 273 is cut on, there is less than a one volt potential drop between terminals 274 and 275. Due to the conduction of controlled rectifier 265, the voltage of the P-emitter 266 drops from battery voltage to approximately one volt above ground potential. At such time, the voltage on capacitors 262 and 263 add to lower the potential of P-emitter 270 of controlled rectifier 269 to approximately 23 volts below ground potential. The voltage on capacitor 264 is such as to lower the potential of gate 271 of controlled rectifier 269 to approximately eleven volts below ground potential. These large back biases across the P-emitter/N-emitter and gate/N-emitter regions of controlled rectifier 269 aid in rapidly turning off this device. Because of the large back-bias voltage from P-emitter to N-emitter on controlled rectifier 269, the field in inductance coil 261 collapses rapidly, therefore inducing a very large voltage in the secondary 259 and producing the necessary voltage spark across gap 260.

During the time that the field is collapsing in inductance coil 261, there exists a damped sinusoidal voltage at terminal 270 due to action of the oscillatory system comprised of primary 258 of inductance coil 261, resistor 255 and capacitor 263. Since the sinusoidal oscillation occurs in the circuit extending to terminal 277 through primary 258, resistor 255, capacitor 263 and diode 276 to ground, the diode 276 allows capacitor 263 to take advantage of the bottom swing of the oscillation at terminal 270, that is, capacitor 263 partially charges during the negative swing of the oscillation. Diode 276 prevents capacitor 263 from subsequently discharging during any positive portion of an oscillation.

Therefore, after the field has completely collapsed in inductance coil 261, capacitor 263 is again partially charged before the next cycle begins. This action increases the repetition rate at which this circuit may perform. After the field has completely collapsed in coil 261, the circuit remains in an equilibrium condition until switch 279 is unclosed, at which point the cycle begins again.

An advantage of the circuits of FIGURE 14 lies in the fact that in order to compensate for the comparatively high inductance primary of the ordinary automobile ignition coil, additional voltage to aid in turning off controlled rectifier 269 more rapidly is obtained by the use of the extra capacitor 262 coupled to capacitor 263 by controlled rectifier 273. In addition, diode 276 allows capacitor 263 to charge partially during the bottom swing of the sinusoidal voltage at terminal 270. In this manner, the spark at gap 260 is enhanced sufficiently to be comparable to the spark obtained at gap 146 in FIGURE 11.

Although the invention has been illustrated by particular embodiments thereof, it is not limited to the specific circuits herein disclosed. Various applications, modifications, and arrangements of the invention will readily occur to those skilled in the art. For example, in certain embodiments, a mechanical switch may be advantageously employed for alternately closing and opening the electrical path through the spark coil or transformer. In addition, in other embodiments, transistors could be variously employed to effect the desired switching operations. In still other embodiments, different transducing elements could be employed as, for example, gas-discharge lamps for producing high energy flashes of light.

The terms and expressions hereinbefore employed in reference to the invention are used as terms of description and not of limitation, and there is no intention in the use of such terms and expressions of excluding equivalence of the features shown and described or parts thereof, but on the contrary it is intended to include herein any and all equivalence, modifications and adaptations which may be employed without departing from the spirit of the invention.

What is claimed is:

1. In a switching circuit having a source of energizing potential, an electronic switching element having a pair of switching terminals and a control terminal, a capacitor interconnected between said control terminal and said source, means effective for applying an activating potential to said control terminal and charging said capacitor to condition said element to a conductive state at one time, and means in said circuit effective at another time for impressing the voltage produced by the charge on said capacitor upon said control terminal in a polarity to render said element non-conductive.

2. In a switching circuit having a source of energizing potential, a controlled rectifier device having a gate, a capacitor interconnected between said gate and said source of energizing potential, means interconnected with said device effective at one time for causing said device to conduct and for charging said capacitor, and means interconnected with said capacitor effective at another time for causing said device to cease conduction, said last-mentioned means being effective for impressing the voltage produced by the charge on said capacitor upon said gate in a polarity to back-bias said gate and aid in terminating conduction through said device.

3. Apparatus according to claim 2 additionally including means connected to said capacitor effective at said another time for discharging said capacitor.

4. In a switching circuit, a controlled rectifier device having a gate, a capacitor interconnected between said gate and a source of energizing potential, means interconnected wtih said capacitor effective at a time when said capacitor is essentially uncharged for applying a potential to said gate through said capacitor for rendering said device conductive and for charging said capacitor, and means interconnected with said capacitor effective at a subsequent time for causing said device to cease conduction and for impressing the voltage produced by the charge on said capacitor upon said gate in a polarity to back-bias said gate and aid in terminating conduction through said device.

5. In a switching circuit, an inductive element, a controlled rectifier having a gate, a source of electrical potential, means interconnecting said inductive element, said controlled rectifier and said source of electrical potential in series, means including a capacitor interconnected between said gate and said source of electrical potential effective at one time for applying an activating potential to said gate thereby conditioning said controlled rectifier to a conducting state and establishing a flow of current in said inductive element, said last-mentioned means being further effective to at least partly charge said capacitor, and means effective at another time for conditioning said controlled rectifier to a non-conducting state, and for impressing the voltage produced by the charge on said capacitor upon said gate in a polarity to back-bias said gate and aid in terminating conduction through said controlled rectifier.

6. In a switching circuit, an inductive element, a controlled rectifier having a pair of switching terminals and a gate terminal, a source of electrical potential, means interconnecting said inductive element, said controlled rectifier and said source of electrical potential in series, a first capacitor connected to one of said switching terminals, a second capacitor connected to said gate terminal, means including said second capacitor effective at one time for applying an activating potential through said second capacitor to said gate thereby conditioning said controlled rectifier to a conducting state and establishing a flow of current in said inductive element, said last-mentioned means further effective to at least partly charge both of said capacitors, and means effective at another time for impressing the voltages produced by the charges on said capacitors respectively upon said one of said switching terminals and upon said gate terminal in back-biasing polarities thereby to terminate conduction through said controlled rectifier.

7. Switching circuits comprising an inductor, a transformer and a first capacitor each interconnected with said inductor, a controlled rectifier device interconnected with said transformer, said controlled rectifier having a gate, a second capacitor connected to said gate, means interconnected with said device through said second capacitor effective at one time for causing said device to conduct thereby to establish a flow of electrical current in said inductor to store energy therein, said means being additionally effective at said one time for at least partly charging said second capacitor, means effective at a subsequent time for causing said device to cease conduction thereby resulting in a flow of current from said inductor to said first capacitor to at least partly charge said first capacitor, said last-mentioned means being also effective at said subsequent time for impressing the voltage produced by the charge impressed on said second capacitor upon said gate in a polarity to back-bias said gate and aid in terminating conduction through said device, and means effective at yet a later time for applying a potential to said gate through said second capacitor thereby rendering said device conductive, abruptly discharging said first capacitor through said transformer, and reestablishing current flow in said inductor.

8. A pulse generator comprising a source of electrical potential, an inductor, a capacitor, a transformer and a transistor; means connecting said inductor, said transformer and said transistor in series to said source of potential; means connecting said capacitor to the junction of said inductor and said transformer; and means connected to said transistor effective at one time for causing said transistor to conduct, thereby producing a current in said inductor and storing energy therein; said last-mentioned means being effective at another time for causing said transistor to cease conducting, thereby resulting in a flow of current from said inductor to said capacitor to at least partly charge said capacitor; said last-mentioned means being effective at still another time for causing said transistor to again conduct, thereby abruptly discharging said capacitor through said transformer and reestablishing current flow in said inductor.

9. In a cyclical switching circuit, a transistor device having a base electrode; an inductor; a transformer; a diode; and a capacitor; a source of energizing potential; means serially interconnecting said diode, inductor, transformer, and transistor in series with said source of potential; means connected to the base of said transistor effective at one time for causing said transistor to conduct, thereby establishing current flow through said diode, inductor, transformer, and transistor; means effective at another time for causing said transistor to cease conduction, thereby terminating current flow in said transformer and causing said inductor to produce current for at least partly charging said capacitor; and means effective at still another time for causing said transistor to again conduct, thereby abruptly discharging said capacitor through said transformer and reestablishing current flow through said inductor.

10. A pulse generator comprising a source of electrical potential, a diode, an inductor, a capacitor, a transformer and a semiconductor controlled rectifier; means connecting said diode, said inductor, said transformer and said controlled rectifier in series to said source of potential; means connecting said capacitor to the junction of said inductor and said transformer; and means connected to said controlled rectifier effective at one time for causing said controlled rectifier to conduct, thereby producing a current in said inductor and storing energy therein; said last-mentioned means being effective at another time for causing said controlled rectifier to cease conducting, thereby resulting in a flow of current from said conductor to said capacitor to at least partly charge said capacitor; said last-mentioned means being effective at still another time for causing said controlled rectifier to again conduct, thereby abruptly discharging said capacitor through said transformer and re-establishing current flow in said inductor, said last-mentioned means including a controlled rectifier and switching means for switching said first-mentioned semiconductor controlled rectifier between conductive and non-conductive states.

11. Circuits according to claim 2 in which the last-mentioned means includes a controlled rectifier and means for switching the last-mentioned controlled rectifier between conductive and non-conductive states.

12. Circuits according to claim 2 in which the last-mentioned means includes an inductor, a controlled rectifier, means interconnecting the last-mentioned inductor and the last-mentioned controlled rectifier to said capacitor, and a switch connected to said last-mentioned controlled rectifier for switching said last-mentioned controlled rectifier between conductive and non-conductive states, thereby alternately to establish current flow in said last-mentioned inductor through said last-mentioned controlled rectifier and to terminate conduction with a concurrent transfer of energy from the last-mentioned inductor to said capacitor to charge said capacitor to a value exceeding the terminal voltage of said source of energizing potential.

13. Circuits according to claim 12 further including a diode serially interconnected with said last-mentioned inductor for preventing reverse-current discharge of said capacitor when said capacitor is charged to the voltage level exceeding that of said source of energizing potential.

14. Circuits according to claim 11 further including a diode connected in shunt of said last-mentioned controlled rectifier poled oppositely to the connected polarity of said last-mentioned controlled rectifier.

15. Circuits according to claim 12 further including another diode connected in shunt of said last-mentioned controlled rectifier and poled oppositely to the connected polarity of said last-mentioned controlled rectifier.

16. In a switching circuit having a source of energizing potential, an induction spark coil having a primary and a secondary winding, a controlled rectifier having a pair of switching terminals and a gate terminal, means interconnecting said induction spark coil, said controlled rectifier and said source of energizing potential in series, a first capacitor connected to one of said switching terminals, a second capacitor connected to said gate terminal, means including said second capacitor effective at one time for applying an activating potential through said second capacitor to said gate terminal thereby conditioning said controlled rectifier to a conducting state and establishing a flow of current in said induction spark coil to store inductive energy therein, said last-mentioned means being further effective to at least partly charge both of said capacitors, and means effective at a subsequent time for impressing the voltages produced by the charges on said first and said second capacitors respectively upon said one of said switching terminals and upon said gate terminal in back-biasing polarities thereby to abruptly terminate conduction through said induction spark coil and induce a high voltage pulse in said secondary winding.

17. Circuits according to claim 16 in which the means mentioned last and said last-mentioned means include a controlled rectifier and means for switching the last-mentioned controlled rectifier between conductive and non-conductive states.

18. Circuits according to claim 16 in which the means mentioned last and said last-mentioned means include an inductor, a controlled rectifier, means interconnecting said inductor and the last-mentioned controlled rectifier with said first and said second capacitors, and a switch connected to said last-mentioned controlled rectifier for switching said last-mentioned controlled rectifier between conductive and non-conductive states, thereby alternately establishing current flow in said inductor through said last-mentioned controlled rectifier and terminating conduction with a concurrent transfer of energy from said inductor to both said first and said second capacitors to charge both said capacitors to values exceeding the terminal voltage of said source of energizing potential.

19. Circuits according to claim 18 further including a diode serially interconnected with said inductor for preventing reverse-current discharge of said capacitors when said capacitors are charged to voltage levels exceeding that of said source of energizing potential.

20. Circuits according to claim 19 further including a resistor connected to said second capacitor for aiding in discharging said second capacitor during said subsequent time.

21. Circuits according to claim 16 in which the means mentioned last and said last-mentioned means include a transistor and means for switching said transistor between conductive and non-conductive states.

22. Circuits according to claim 16 in which said last-mentioned means comprises a third capacitor, a switching element serially interconnecting said third capacitor with said first capacitor, another switching element, means including said switching elements effective at said one time for charging said first capacitor and said third capacitor each to a value greater than half the voltage of said source of energizing potential, and means including said switching elements effective at said subsequent time for effectively impressing the sum of the voltages of said first and said third capacitors upon said one of said switching terminals to back-bias said one of said switching terminals to a back-biasing voltage greater in magnitude than the voltage of said source of energizing potential.

References Cited by the Examiner

UNITED STATES PATENTS

| | | | |
|---|---|---|---|
| 2,030,228 | 2/36 | Randolph et al. | 315—209 |
| 2,197,114 | 4/40 | Rabezzana et al. | 315—209 |
| 2,769,021 | 10/56 | Crosby | 315—209 |
| 2,791,724 | 5/57 | Ekblom | 315—209 |
| 2,943,131 | 1/60 | Kerr | 315—209 |
| 2,955,248 | 10/60 | Short | 315—209 |
| 2,968,296 | 1/61 | Kaehni | 315—209 |
| 3,019,355 | 1/62 | Morgan. | |
| 3,045,148 | 7/62 | McNulty et al. | 315—209 |
| 3,089,960 | 5/63 | Bailey | 323—62 X |

SAMUEL BERNSTEIN, *Primary Examiner.*